United States Patent
Cadenhead et al.

[19]

[11] Patent Number: 6,045,368

[45] Date of Patent: Apr. 4, 2000

[54] MEANS FOR ACCURATELY ALIGNING AND ATTACHING AN ELECTRICAL PART TO A SURFACE MOUNT CIRCUIT

[76] Inventors: Jonathan Cadenhead, 16029 E. Edinburgh Dr., Loxahatchee, Fla. 33470; Terry Richard Fleegle, 4140 NW. 8th La., Pompano, Fla. 33064; Michael Carlos Menard, 3801 Sandpiper Dr., #8, Boynton Beach, Fla. 33436

[21] Appl. No.: 09/088,010

[22] Filed: Jun. 1, 1998

[51] Int. Cl.⁷ .................................................. H01R 9/09
[52] U.S. Cl. .................................................. 439/67; 361/749
[58] Field of Search ......................... 439/67, 493, 77, 439/83, 931, 876; 361/749

[56] References Cited

U.S. PATENT DOCUMENTS 4,678,250  7/1987  Romine et al. ............................ 439/83
5,641,291  6/1997  Sueki et al. .............................. 439/83
5,726,861  3/1998  Ostrem .................................... 361/767

*Primary Examiner*—Steven L. Stephan
*Assistant Examiner*—Amir Abdulmelik
*Attorney, Agent, or Firm*—James A. Lamb

[57] ABSTRACT

An electrical circuit includes a substrate having at least two alignment pads on the substrate that are accurately aligned with a first set of electrical interconnect pads, and also includes a corresponding number of alignment posts that are cylindrical and have flat bases that are geometrically similar to and smaller than a corresponding shape of each of the at least two alignment pads by a predetermined solder fillet radius. Each of the at least two alignment posts is reflow soldered to one of the at least two alignment pads. An electrical part can be accurately aligned to the substrate using the alignment posts, during attachment of the electrical part.

7 Claims, 3 Drawing Sheets

6,045,368

MEANS FOR ACCURATELY ALIGNING AND ATTACHING AN ELECTRICAL PART TO A SURFACE MOUNT CIRCUIT

FIELD OF THE INVENTION

This invention relates in general to attaching electronic parts to a surface mount circuit, and in particular to a method and means for aligning electronic parts to a surface mount circuit during attachment that improves alignment accuracy and saves substrate space.

BACKGROUND OF THE INVENTION

Known techniques of mounting electronic parts to a surface mount circuit that is fabricated on a substrate such as a printed circuit board or a flex circuit include the use of alignment holes in the substrate, or utilize fixturing that is used at the time of attachment of the part. As an example of the use of alignment holes in the substrate, pins that are a portion of the electronic part fit into the alignment holes during and after attachment of the electronic part to the substrate. Another example of the use of alignment holes is when fixturing pins are temporarily passed through holes in both the electronic part and the substrate. As another example of fixturing, a specially made tool can be make to align a flat, flexible liquid crystal display cable to a printed circuit board during a heat seal process. Such a fixture can, for instance, be made to align itself to edges of the board and edges of the cable. As yet another example of fixturing, indicia on the cable can be manually aligned by an operator using optical magnification aids during the heat seal process for the flat cable. Each of these approaches, although successfully employed in the past, has problems that are exacerbated as circuits continue to be designed smaller in order to achieve smaller, better products. One of the methods used to achieve smaller circuits is to using higher density circuit interconnections, which makes the required alignment of electronic parts to the substrate more critical.

In the first example of alignment methods, holes in the substrate take up an increasing portion of substrate surface area as circuits become smaller, because the pins used with the holes must be large enough to withstand the forces involved when they are inserted. Furthermore, there are practical limits to the accuracy of alignment of the pins to the holes. In other methods described above, the use of edges of the substrate and cable lead to inaccuracy caused by the tolerances in aligning the interconnects to the edges. Finally, alignment using human operators has lower practical limits that lead to inaccuracies.

Thus, what is needed is an improved method of aligning parts attached to a surface mount circuit.

DETAILED DESCRIPTION OF A PREFERRED EMBODIMENT

Figure 1:
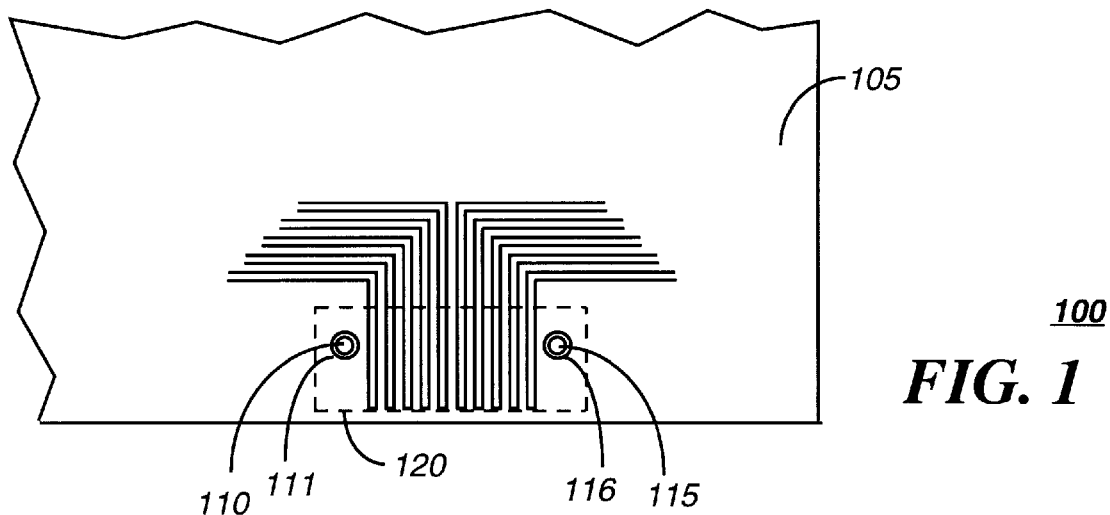
FIG. 1 is a mechanical plan view drawing showing a portion of a surface mount circuit substrate used in an electronic device, in accordance with the preferred embodiment of the present invention.

Referring to FIG. 1, a mechanical plan view drawing of a portion 105 of a surface mount circuit substrate 100 (also called simply the substrate 100) used in an electronic device is shown, in accordance with the preferred embodiment of the present invention. The substrate 100 has electrical interconnection metallizations on it, commonly called runners. FIG. 1 illustrates the substrate 100 after surface mount parts have been soldered thereto. The runners include a first set of electrical interconnect pads 120 that are finely pitched, for example on 12 mil (0.030 centimeter (cm)) centers, and each interconnect pad is 6 mil (152 micron) wide. Although ten such interconnect pads are actually illustrated in the drawing, it will be appreciated that in a typical application, such as a set of interconnect pads for a liquid crystal display, or for a microprocessor bus, there can be many more such interconnect pads, e.g., 80. Also, it will be appreciated that only a portion of the runners near to and including the first set of electrical interconnect pads 120 are shown; the distal portion of the runners and other solder pads are not shown, for simplicity.

Figure 2:
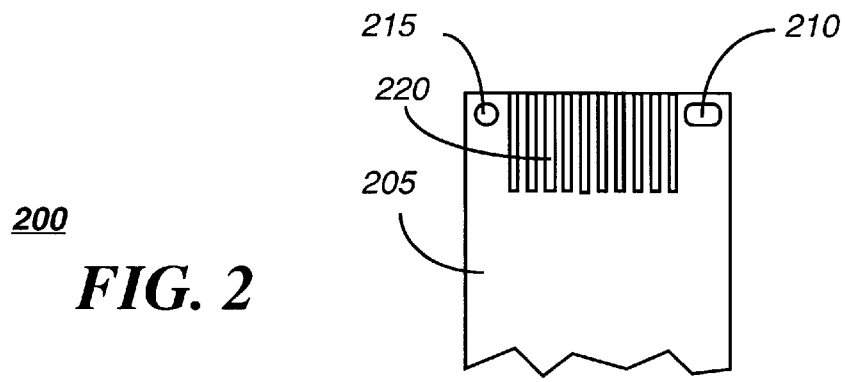
FIG. 2 is a mechanical plan view drawing showing a portion of an interconnect cable used in an electronic device, in accordance with the preferred embodiment of the present invention.

Referring to FIG. 2, a mechanical plan view drawing of a portion of an interconnect cable 200 used in the electronic device is shown, in accordance with the preferred embodiment of the present invention. The view in FIG. 2 shows an interconnect side of the interconnect cable 100. The interconnect cable 100 has runners embedded in it. The runners include a second set of electrical interconnect pads 220 that are finely pitched to the same centers as the first set of electrical interconnect pads 120 on the substrate 100, and each interconnect pad is approximately the same width as those on the substrate 100. Again, although ten such interconnect pads are actually illustrated in the drawing, it will be appreciated that there are preferably as many such interconnect pads in the corresponding set of electrical interconnect pads on the interconnect cable 200 as there are in the first set of electrical interconnect pads 120 on the substrate 100. The metallization of the runners is exposed in the area of the first set of electrical interconnect pads 120 on the substrate 100 and in the area of the second set of electrical interconnect pads 220, so as to allow a conductive connection between respective individual interconnect pads of the sets of electrical interconnect pads on the substrate 100 and interconnect cable 200. In accordance with the preferred embodiment of the present invention, the conductive connections are accomplished by the technique of heat sealing, which is well known to one of ordinary skill in the art.

It will be appreciated that accomplishing an alignment of the sets of electrical interconnections is a problem in prior art circuits when fine pitches are involved, as described above. For example, when alignment holes are drilled in the substrate 100 and punched in the interconnect cable 200, the accuracy of the centers of the holes to the electrical interconnect pads is typically ±3 mil (76 micron). Additionally, the size of the holes typically varies by ±5 mil (127 micron). Such accuracies were satisfactory in prior art products when the electrical interconnect pads were on 20 mil (508 micron) centers and the runners were 10 or 12 mil (254 or 305 micron) wide, but such accuracies are becoming unacceptable with present day fine pitched runners. Other prior art techniques are used to overcome such hole alignment difficulties, such as optical alignment techniques, but they are typically time consuming.

In accordance with the preferred embodiment of the present invention, circular surface mount alignment solder pads 111, 116 (hereinafter, simply alignment pads) are included in the design of the electrical interconnection metallization artworks that are used to fabricate the metallizations on the substrate 100. When included this way in the design of the metallization patterns, the centers of the alignment pads 111, 116 are aligned to an accuracy of approximately 0.5 mil (13 micron) with respect to the first set of electrical interconnect pads 120, and have a 0.5 mil (13 micron) variation in pad size. A surface mount alignment post 110, 115 is then soldered, preferably using a solder compound and a reflow solder technique, onto the alignment pad 111, 116. The solder compound is preferably a conventional solder paste but can alternatively be a solder plating applied to the substrate 100 at the time of its manufacture. Conventional reflow soldering techniques such as oven reflow or localized hot air soldering are used to reflow (melt) the solder. The interconnect cable 200 has punched in it two alignment holes 215, 210 that correspond to the locations of the alignment posts 110, 115. One of the alignment holes 215 is round and is larger than the alignment posts 115 by a minimum clearance required to allow the alignment hole 215 to fit over the alignment post 115 with a reasonable force under normal assembly conditions. The other of the alignment holes 210 is elongated and has a small dimension that is larger than the alignment post 110 by the minimum clearance, and is elongated (i.e., has a long dimension) by an offset amount that is determined to allow for a maximum combined variation of a separation between the alignment posts and a separation between the punched holes. At time of assembly, the interconnection cable 200 is turned so the exposed first set of electrical interconnect pads 120 on the substrate 100 face the exposed second set of corresponding electrical interconnect pads 220 on the interconnect cable 200, and the interconnections are made permanent by heat sealing them. Since heat sealing is done at a temperature below that of reflow soldering, the alignment posts 110, 115 remain in position and the electrical part remains aligned during attachment.

Figure 3:
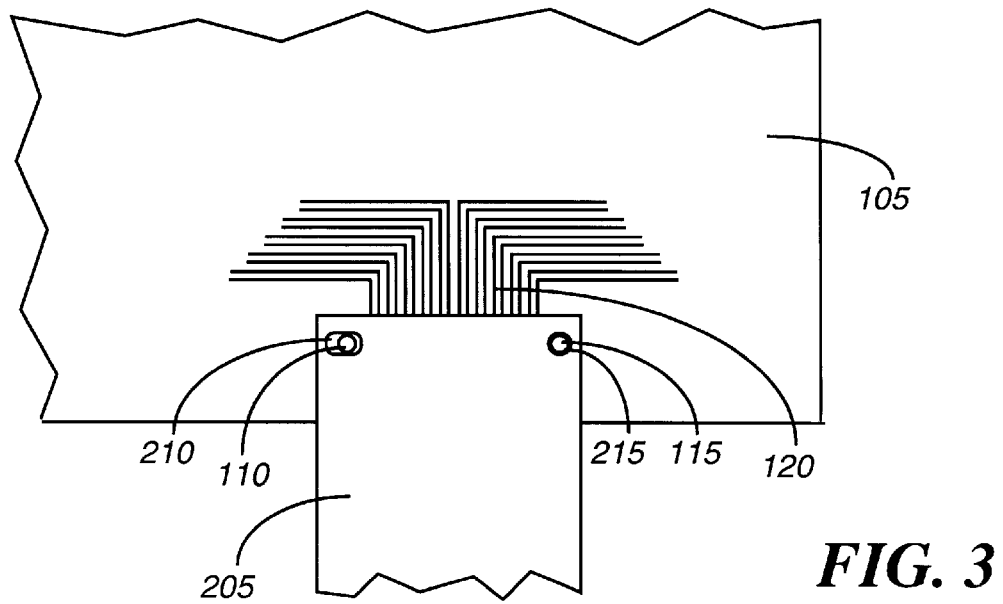
FIG. 3 is a mechanical assembly drawing showing the interconnect cable aligned to the surface mount circuit substrate, in accordance with the preferred embodiment of the present invention.

Referring to FIG. 3, a mechanical assembly drawing of the interconnect cable aligned to the surface mount circuit substrate is shown, in accordance with the preferred embodiment of the present invention. The alignment posts 110, 115 are within the alignment holes 210, 215.

Figure 4:
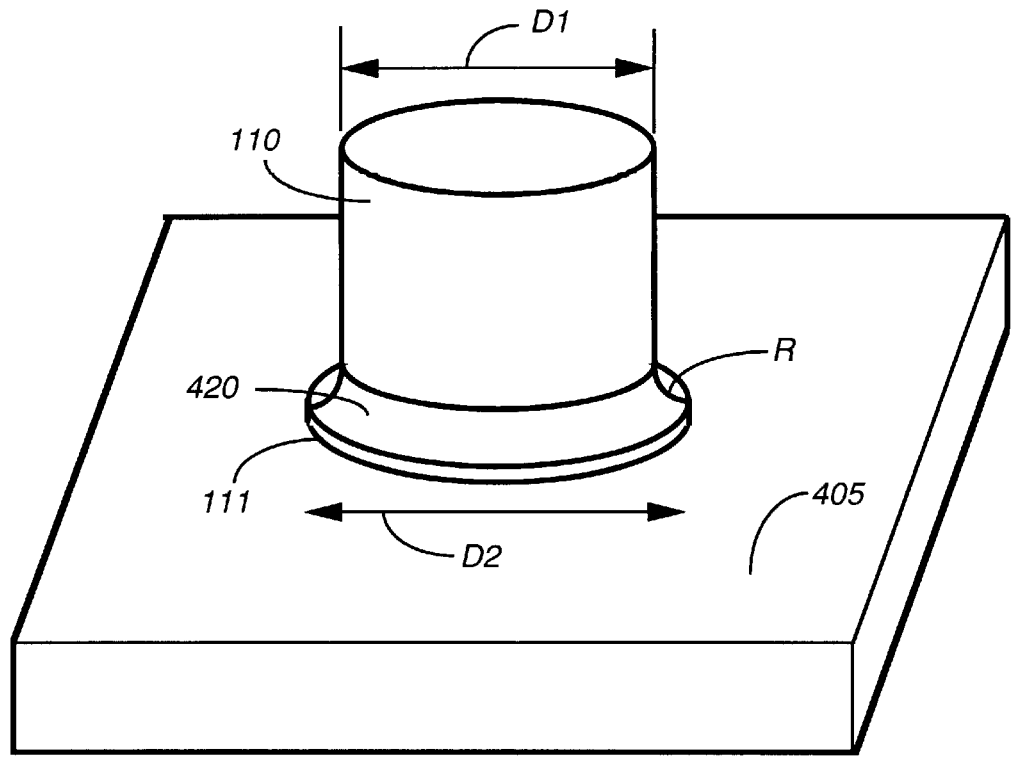
FIG. 4 is a detail mechanical perspective view drawing showing an alignment post soldered to the surface mount circuit substrate, in accordance with the preferred embodiment of the present invention.

Referring to FIG. 4, a detail mechanical perspective view drawing of an alignment post 110 soldered to the surface mount circuit substrate 100 is shown, in accordance with the preferred embodiment of the present invention. A small portion 405 of the substrate 100 is shown. The alignment post 110, which is a right circular cylinder having diameter D1, is soldered to the alignment pad 111, which is circular pad of diameter D2. During reflow, liquid solder forms a solder fillet 420 around the base of the alignment post 110. The solder fillet 420 has a radius R that is determined by such factors as the weight of the alignment post 110, the type of solder used, the temperature profile of the soldering operation, and the materials of the alignment pad 111 and alignment post 110. In accordance with the preferred embodiment of the present invention, the radius, R, of the solder fillet is predetermined in a conventional manner by using experiments involving samples of the alignment posts 110, 115 and the substrate 100, or by using known technical data, or by a combination of both techniques. It will be appreciated that the solder fillet radius R is essentially independent of the size of the alignment pad, as long as the alignment pad is larger than the alignment post by an amount R at all points around the periphery of the base, and the radius R is essentially independent of the shape of the base of the alignment posts 110, 115. Having established a predetermined solder fillet radius, the alignment pad 111 is designed with a diameter D2 that is equal to the diameter D1 of the base of the alignment post 110 plus twice a predetermined solder fillet radius, thus making the size of the base of the alignment posts 110, 115 smaller than the alignment pads 111, 116 by the solder fillet radius, R. When this technique is used, the alignment post 110 will, during reflow soldering, center itself to the alignment pad 111, typically within ±1 mil (25 micron) of error, and rarely with more than ±2 mil (51 micron) of error.

It will be appreciated, therefore, that the amount of error in the alignment of the first set of electrical interconnect pads 120 on the substrate 100 to the second set of interconnect pads 220 on the interconnect cable 200 is substantially reduced by the present invention. Furthermore, it will be appreciated that in comparison to the prior art technique of using holes through the substrate 100 to accomplish alignment, the use of the alignment pads 111, 116 increases the amount of circuit layout area available on the substrate, because the inner layers (in multilayer substrates) and the layer on the outer face of the substrate, opposite the layer having the alignment pads 111, 116 can be used for runners or pads, and the opposite outer layer can be used for surface mount parts. This increase can be substantial on a small substrate 100.

Figure 5:
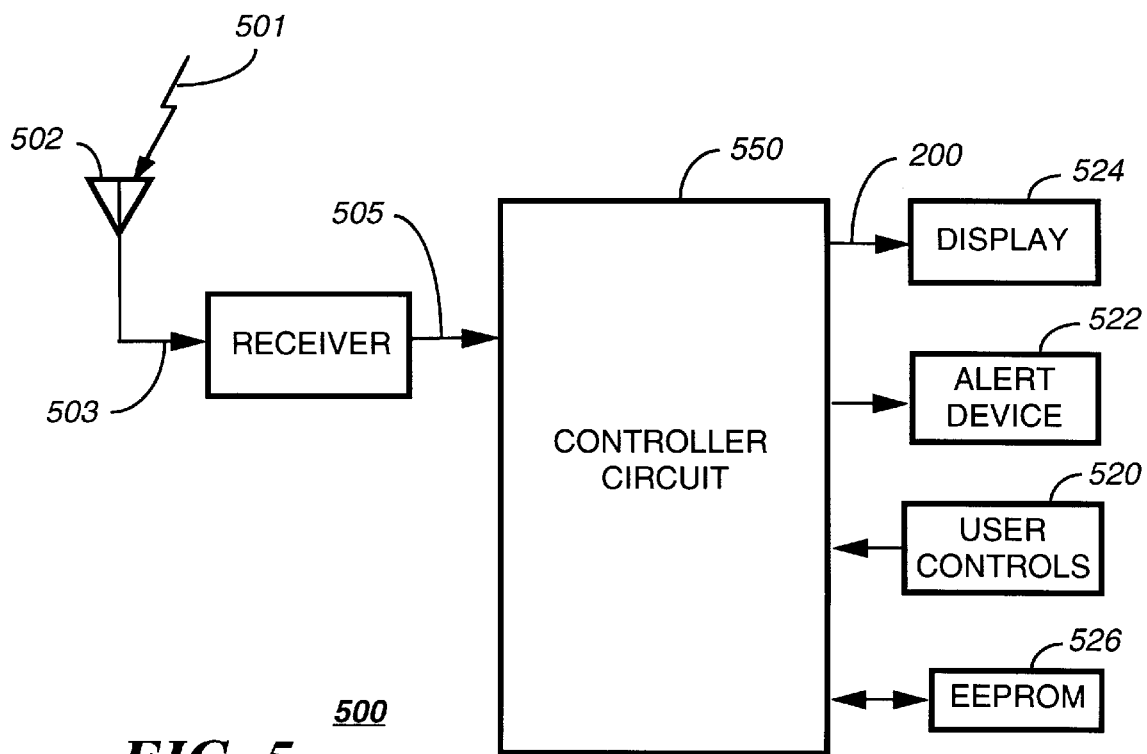
FIG. 5 is an electrical block diagram showing a selective call radio in which the circuit surface mount circuit and interconnect cable are used, in accordance with the preferred embodiment of the present invention.

Referring to FIG. 5, an electrical block diagram of a radio 500 is shown, in accordance with the preferred and alternative embodiments of the present invention. The radio 500 is a selective call radio that includes an antenna 502 for intercepting a radiated signal 501. The antenna 502 converts the intercepted radiated signal 501 to a conducted radio signal 503 that is coupled to a receiver 504 wherein the conducted radio signal 503 is received. The receiver 504 generates a demodulated signal 505 that is coupled to a controller 550. The controller circuit 550 is coupled to a display 524, an alert 522, a set of user controls 520, and an electrically erasable read only memory (EEPROM) 526. The controller circuit 550 is coupled to an EEPROM 526 for storing an embedded address stored therein during a maintenance operation and for loading the embedded address during normal operations of the radio 500. The controller circuit 550 comprises a conventional microprocessor having a central processing unit (CPU), a read only memory (ROM), and a random access memory (RAM).

A message processor function of the microprocessor 560 decodes outbound messages, and processes an outbound message when an address received in the address field of the outbound signaling protocol matches the embedded address stored in the EEPROM 526, in a manner well known to one of ordinary skill in the art for a selective call radio. An outbound message that has been determined to be for the radio 500 by the address matching is processed by the controller 550 according to the contents of the outbound message and according to modes set by manipulation of the set of user controls 520, in a conventional manner. An alert signal is typically generated when an outbound message includes user information. The alert signal is coupled to the alert device 522, which is typically either an audible or a silent alerting device.

When the outbound message includes alphanumeric or graphic information, the information is coupled to a display 524 by the interconnect cable 200 at a time determined by manipulation of the set of user controls 520. The display comprises the substrate 100. The interconnect cable 200 has been aligned, attached, and electrically connected to the display substrate 100 using the technique involving surface mounted alignment posts 110, 115 described herein.

It will be appreciated that the technique of aligning an electrical part 200 to a surface mount circuit 100 can be used for circuits other than LCD circuits, such a microprocessor circuits, and can be used in many different electronic apparatus other than selective call radios, such as portable tape recorders, video cameras, and portable broadcast radio receivers. It will be further appreciated that the technique of adding alignment posts to a surface mount circuit can be used for other alignment purposes, such as aligning a flexible surface mount circuit to the interior of a housing of an electronic apparatus that has holes in the housing into which the alignment posts fit.

Figure 6:
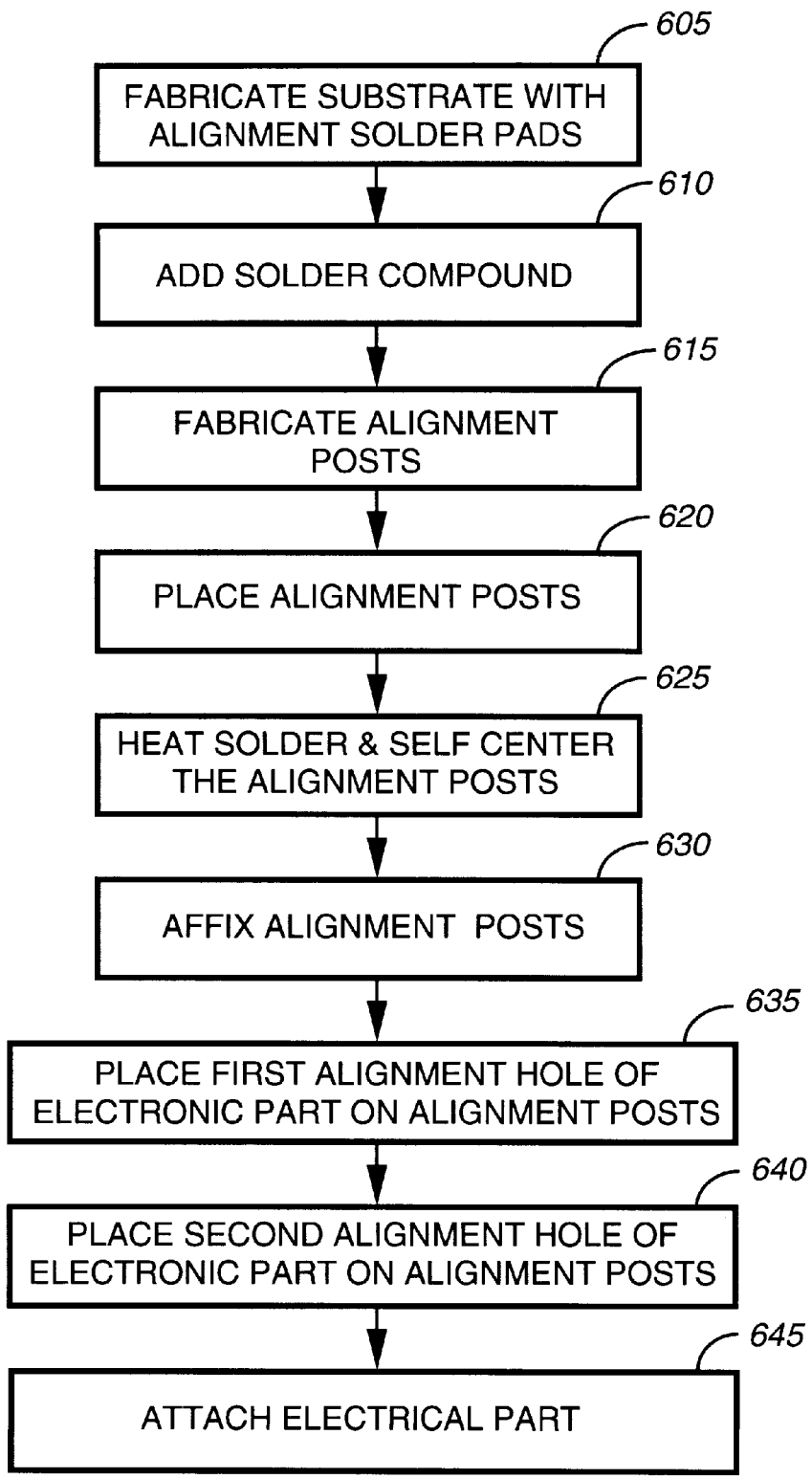
FIG. 6 is a flow chart of a method used to align, attach, and electrically interconnect the interconnection cable to the surface mount circuit substrate, in accordance with the preferred embodiment of the present invention.

Referring to FIG. 6, a flow chart of a method used to align, attach, and electrically interconnect the interconnection cable 200 to the surface mount circuit substrate 100 is shown, in accordance with the preferred embodiment of the present invention. At step 605, the substrate 100 is fabricated having a set of two alignment pads 111, 116 that are accurately aligned with a first set of electrical interconnect pads 120. Each alignment pad in the set of alignment pads 111, 116 has a circular shape with a diameter D2. The set of alignment pads 111, 116 are fabricated on a solid portion of the substrate 100 (i.e., no hole is within the alignment pads 111, 116). At step 610 a solder compound is added to the alignment pads 111, 116 (as well as to all other solder pads (not shown in FIGS. 1 and 3) on the substrate 100). At step 615, a set of alignment posts 110, 115 are fabricated as right circular cylinders having diameter D1 that are compatible with reflow soldering, preferably using conventional machine screw and metal plating techniques. The diameter, D2, of each of the set of alignment pads 111, 116 is equal to a diameter, D1, of a base of each of the set of alignment posts 110, 115 plus twice a predetermined solder fillet radius, R. At step 620, the alignment posts 110, 115 are placed onto the solder compound on the set of alignment pads 111, 116. At step 625, the set of alignment posts 110, 115 are centered on the set of alignment pads 111, 116 by melting the solder compound. At step 630, the set of alignment posts 110, 115 are affixed to the set of alignment pads 111, 116 by cooling the solder compound.

At step 635, the alignment hole 210 of the electronic part 200 is placed onto the alignment post 110. The electronic part 200 has the alignment hole 210 accurately aligned with a second set of electrical interconnect pads 220. The alignment hole 210 is similar in shape to, and larger than the alignment post 110 by a predetermined minimum clearance. In accordance with the preferred embodiment of the present invention, the alignment hole 210 is circular. A second alignment hole 215 is elongated in shape by a predetermined offset amount. At step 640, the second alignment hole is placed onto the alignment post 115. At step 645, the first set of electrical interconnect pads 120 are attached and electrically interconnected to the second set of electrical interconnect pads 220 located on the substrate 100, preferably using an attachment technique that employs temperatures significantly lower that the temperature at which the solder begins to flow.

It will be appreciated that, more generally, the surface mount circuit substrate 100 can be a printed circuit board, a flex circuit, or a ceramic substrate having conductive patterns thereon within which the alignment pads 111, 116 are included, and to which alignment pads 111, 116 the alignment posts 110, 115 are reflow soldered. The alignment posts 110, 115 can then be used to accurately align the surface mount circuit substrate to an electrical part. The electrical part can be an interconnect cable, as described above, or any other electrical part, as long as the attachment of the electrical part to the substrate 100 is accomplished in a manner that does not re-melt the solder used to attach the alignment posts 110, 115. Furthermore, although right circular cylindrical alignment posts and pads are preferred, it will be appreciated that other right cylindrical shapes can be used. For example, square right cylindrical alignment posts and alignment pads can be used. Other shapes will provide self centering so some degree, thereby still providing the benefit of improved alignment. Another shape of the alignment posts that can be used is a shape that has two circular diameters; one at the base and another above the base. In accordance with alternative embodiments of the present invention, when shapes other than circular shapes are used, the shape of the alignment pads is designed to be geometrically similar to and larger than a base of the alignment post by the predetermined solder fillet radius described above. It will be further appreciated that more than two alignment posts on the substrate and a corresponding number of alignment holes in the electrical part can be used, for example, when the cable has an ell shape to accommodate electrical interconnect pads that are on two edges of a substrate.

By now it should be appreciated that there has been provided a technique that accomplishes more accurate alignment of a part to a surface mount circuit than prior art techniques, that is particularly useful for aligning an electrical part to a surface mount circuit that is attached by heat sealing. The technique also increases the amount of circuit layout area on the surface mount circuit.

We claim:

1. A surface mount circuit, comprising:
    a substrate having at least two alignment pads on the substrate, accurately aligned with a first set of electrical interconnect pads on the substrate; and
    a corresponding number of alignment posts that are cylindrical and have flat bases that are geometrically similar to and smaller than a corresponding shape of each of the at least two alignment pads by a predetermined solder fillet radius, wherein each alignment post is reflow soldered by its flat base to one of the at least two alignment pads.

2. The surface mount circuit according to claim 1, wherein each of the at least two alignment pads has a circular shape, and wherein each of the corresponding number of alignment posts has a circular base.

3. An electronic circuit, comprising:
    a substrate having at least two alignment pads on the substrate, accurately aligned with a first set of electrical interconnect pads on the substrate; and
    a corresponding number of alignment posts that are cylindrical and have flat bases that are geometrically similar to and smaller than a corresponding shape of each of the at least two alignment pads by a predetermined solder fillet radius, wherein each alignment post is reflow soldered by its flat base to one of the at least two alignment pads using a solder compound; and
    an electronic part that has a corresponding number of alignment holes accurately aligned with a second set of electrical interconnect pads and into which alignment holes the corresponding number of alignment posts are inserted, wherein the first set of electrical interconnect pads are aligned and electrically connected to the second set of electrical interconnect pads.

4. The electronic circuit according to claim 3, wherein the electronic part has a first alignment hole that is larger than a first one of the corresponding number of alignment posts by a predetermined minimum clearance.

5. The electronic circuit according to claim 3, wherein the electronic part has a second alignment hole that is elongated in shape by a predetermined offset amount.

6. The electronic circuit according to claim 3, wherein the solder compound is one of a solder plating or a solder paste.

7. An electronic apparatus comprising:
    a substrate having at least two alignment pads on the substrate, accurately aligned with a first set of electrical interconnect pads on the substrate;
    a corresionding number of alignment posts that are cylindrical and have flat bases that are geometrically similar to and smaller than a corresponding shape of each of the at least two alignment pads by a predetermined solder fillet radius, wherein each alignment post is reflow soldered by its flat base to one of the at least two alignment pads using a solder compound; and
    an electronic part that has a corresponding number of alignment holes accurately aligned with a second set of electrical interconnect pads and into which alignment holes the corresponding number of alignment posts are inserted, wherein the first set of electrical interconnect pads are aligned and electrically connected to the second set of electrical interconnect pads.

* * * * *